United States Patent
Bemat et al.

(10) Patent No.: US 10,673,329 B2
(45) Date of Patent: Jun. 2, 2020

(54) MULTIPHASE VOLTAGE REGULATOR

(71) Applicant: HEWLETT PACKARD ENTERPRISE DEVELOPMENT LP, Houston, TX (US)

(72) Inventors: Mohamed Amin Bemat, Cypress, TX (US); Kirk Yates, Sacramento, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 148 days.

(21) Appl. No.: 15/923,624

(22) Filed: Mar. 16, 2018

(65) Prior Publication Data
US 2019/0288599 A1    Sep. 19, 2019

(51) Int. Cl.
| | |
|---|---|
| H02M 3/156 | (2006.01) |
| H02M 1/08 | (2006.01) |
| H02M 1/14 | (2006.01) |
| G06F 1/26 | (2006.01) |
| H03H 7/01 | (2006.01) |
| H02M 1/00 | (2006.01) |

(52) U.S. Cl.
CPC .............. *H02M 3/156* (2013.01); *G06F 1/26* (2013.01); *H02M 1/08* (2013.01); *H02M 1/143* (2013.01); *H03H 7/0115* (2013.01); *H02M 2001/0048* (2013.01)

(58) Field of Classification Search
CPC ........ H02M 1/08; H02M 1/143; H02M 3/156; H02M 3/158; H02M 1/1584; H02M 2001/0048; H03H 7/01; H03H 7/0115; G06F 1/26

See application file for complete search history.

(56) References Cited

U.S. PATENT DOCUMENTS

| | | | |
|---|---|---|---|
| 6,594,556 B1* | 7/2003 | Agatstein | G06F 1/26 323/282 |
| 7,023,672 B2 | 4/2006 | Goodfellow et al. | |
| 7,898,233 B2 | 3/2011 | Sato et al. | |
| 8,264,213 B2 | 9/2012 | Lin et al. | |
| 9,348,346 B2 | 5/2016 | Abhishek et al. | |
| 2004/0215991 A1 | 10/2004 | McAfee et al. | |
| 2005/0001597 A1* | 1/2005 | Walters | H02J 1/102 323/222 |
| 2008/0024103 A1* | 1/2008 | Komiya | H02M 3/1584 323/282 |
| 2010/0244788 A1* | 9/2010 | Chen | H02M 3/1584 323/234 |

(Continued)

OTHER PUBLICATIONS

Noah Sturcken et al., "A 2.5d Integrated Voltage Regulator Using Coupled-Magnetic-Core Inductors on Silicon Interposer," IEEE Journal of Solid-State Circuits, Jan. 2013, p.

*Primary Examiner* — Matthew V Nguyen
(74) *Attorney, Agent, or Firm* — Hewlett Packard Enterprise Patent Department

(57) ABSTRACT

Examples herein relate to a multiphase voltage regulator, comprising a pulse-width modulation PWM controller to output a plurality of PWM signals for driving a plurality of pluggable stand-alone voltage regulator converter stage, wherein each pluggable stand-alone voltage regulator converter stage receives one of the PWM signals and delivers a regulated output voltage signal, wherein a contribution of the regulated output voltage signals is delivered to a load connected onto a printed circuit assembly PCA.

20 Claims, 6 Drawing Sheets

(56) References Cited

U.S. PATENT DOCUMENTS

2013/0027009 A1\* 1/2013 Tang ................... H02M 3/1584
  323/271
2014/0327426 A1\* 11/2014 Shterzer ................... H03K 3/53
  323/364

\* cited by examiner

MULTIPHASE VOLTAGE REGULATOR

BACKGROUND

Voltage regulators are commonly used to change the voltage or polarity of a direct current ("DC") power supply. A DC to DC converter may have several phases connected in parallel, with each phase having a plurality of switches connected to an inductor. Pulse-width modulation ("PWM") control can be used in voltage regulators. By supplying switching voltage to the inductor and with an appropriate duty cycle, the output may approximate a voltage at a desired level. When the output voltage is lower than the desired voltage, it turns on the switch connected to the inductor. When the output voltage is above the desired voltage, it turns off the switch. Such multiple phase voltage regulators are used for providing regulated DC power for transient loads such as microprocessors, telecommunications electronics, dual in-line memory modules ("DIMMs") etc.

BRIEF DESCRIPTION OF THE DRAWINGS

Single-phase voltage regulators work well for low-voltage converter applications with currents of up to approximately 25 A, but power dissipation and efficiency start to become an issue at higher currents. One suitable approach is to use multiphase switching voltage regulators.

An approach to provide low voltage, high current, high slew rate step load transient load regulation to critical system loads like microprocessors and dynamic random-access memories ("DRAMs") can be using multi-phase switching voltage regulators that can convert input DC voltage, e.g., 5V, 12V, up to 48V typically to output DC voltage 0.9V up to 1.8V typically. The multiphase voltage regulators use more than one phase in parallel and switching in phase shift order with each other to accomplish high bandwidth response to stringent output load transitions. They can be designed on the same printed circuit assembly ("PCA"), which houses end loads like control processor units, central processing units ("CPUs") and Memory DIMMs. A DIMM or dual in-line memory module comprises a series of dynamic random-access memory integrated circuits. These modules are mounted on a printed circuit board, PCB as part of a printed circuit assembly, PCA and can be designed for use in personal computers, workstations and servers.

Alternatively, multi-phase switching voltage regulators can be comprised by pluggable stand-alone voltage regulator converter stages or on-board voltage regulator converter stages assembled onto the PCA which houses target specific loads as, e.g., processors and Memory DIMMs and wherein each stage is associated with one phase. One of the proposed implementations according to the present disclosure can comprise hybrid approach of designing a minimum number of phases on the PCA to meet a lowest common denominator power requirement of the target high transient load on the PCA by using on-board voltage regulator converter stages and additional phases associated pluggable stand-alone voltage regulator converter stages when using higher power loads.

This implementation can achieve several advantages and few drawbacks, e.g. reduces total cost of base line PCA, reduces the number of parts in the voltage regulator so to increase design reliability, increases ease of service by using replaceable modules, offers a potential thermal advantage due to available height allowing airflow between the converter stages, adds potential thermal impedance to downstream board components and adds impedance in a power distribution path which can increase power losses and pose dynamic load regulation challenges.

Figure 1:
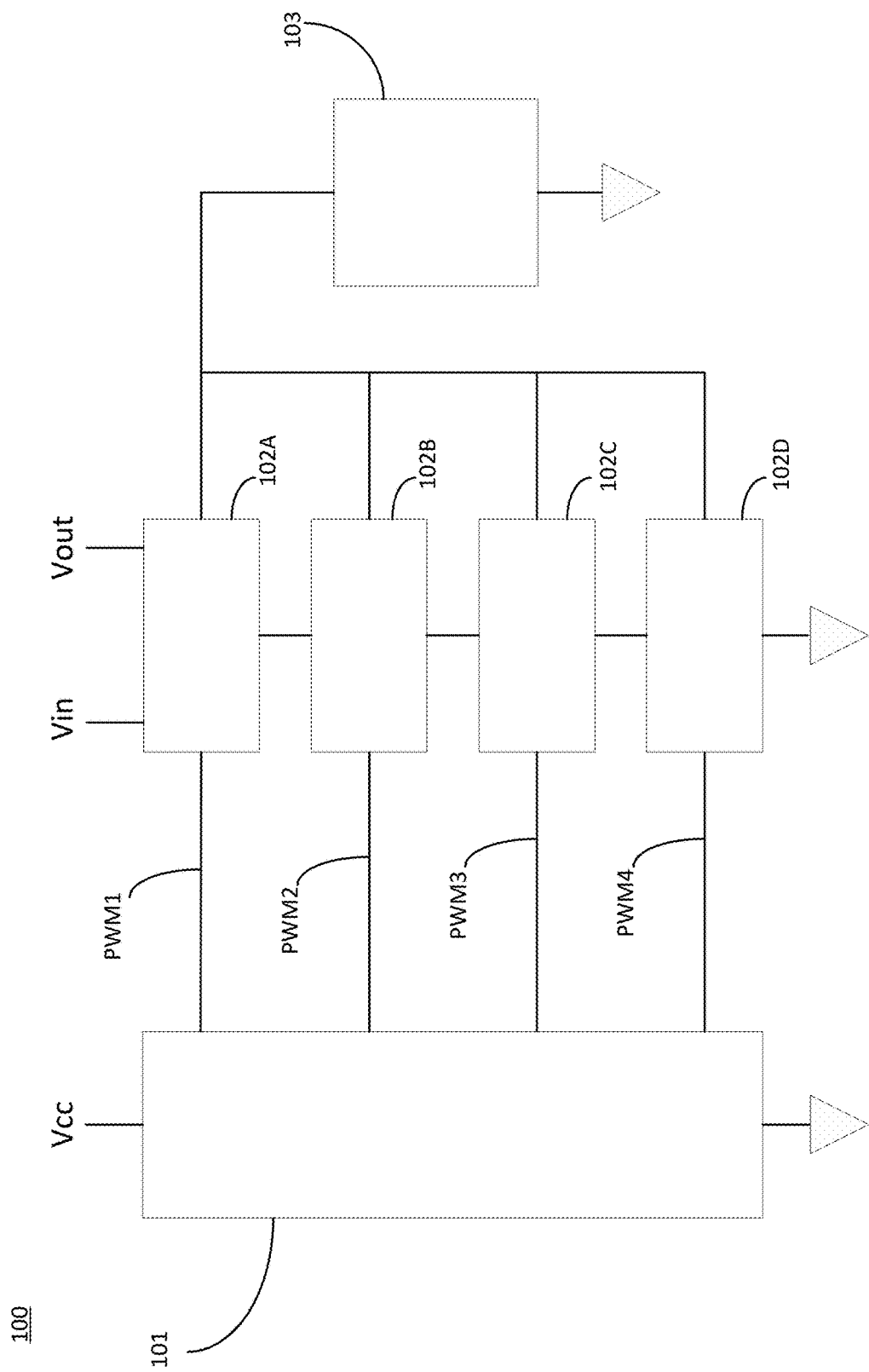

The following detailed description references the drawings, wherein:

FIG. 1 illustrates an example of a multiphase voltage regulator according to the present disclosure.

Figure 2:
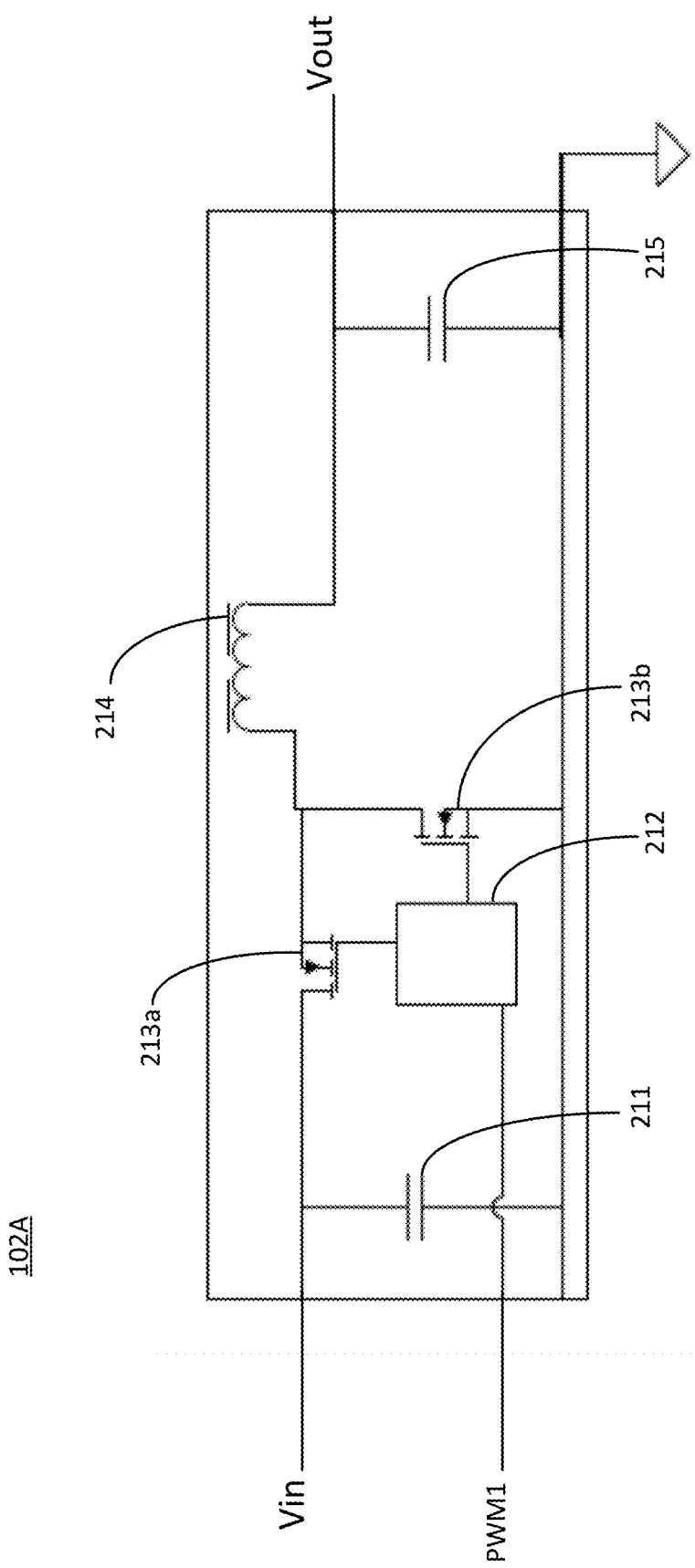

FIG. 2 illustrates an example of a pluggable stand-alone voltage regulator converter stage according to the present disclosure.

Figure 3:
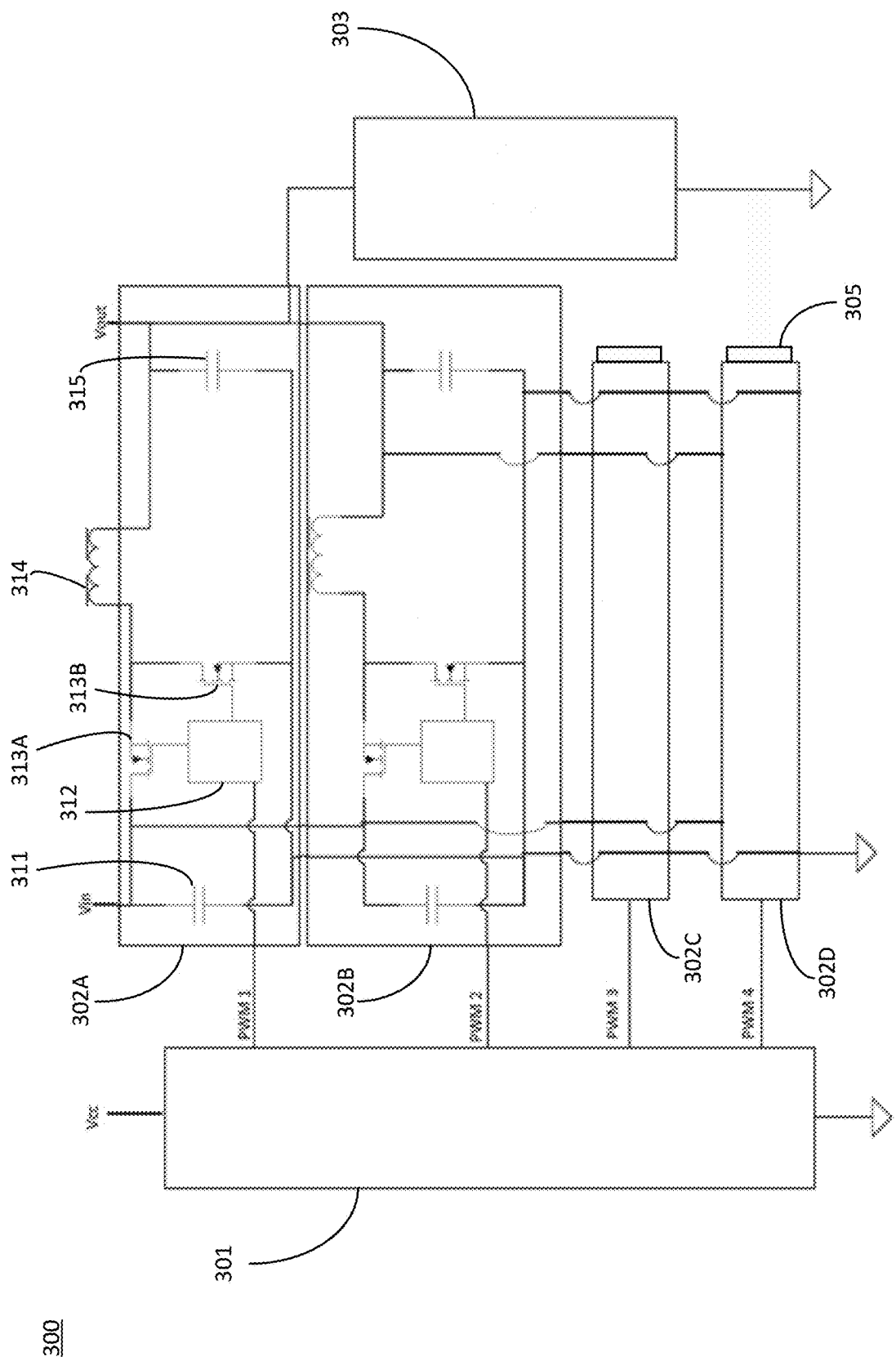

FIG. 3 illustrates another example of a multiphase voltage regulator according to the present disclosure.

Figure 4:
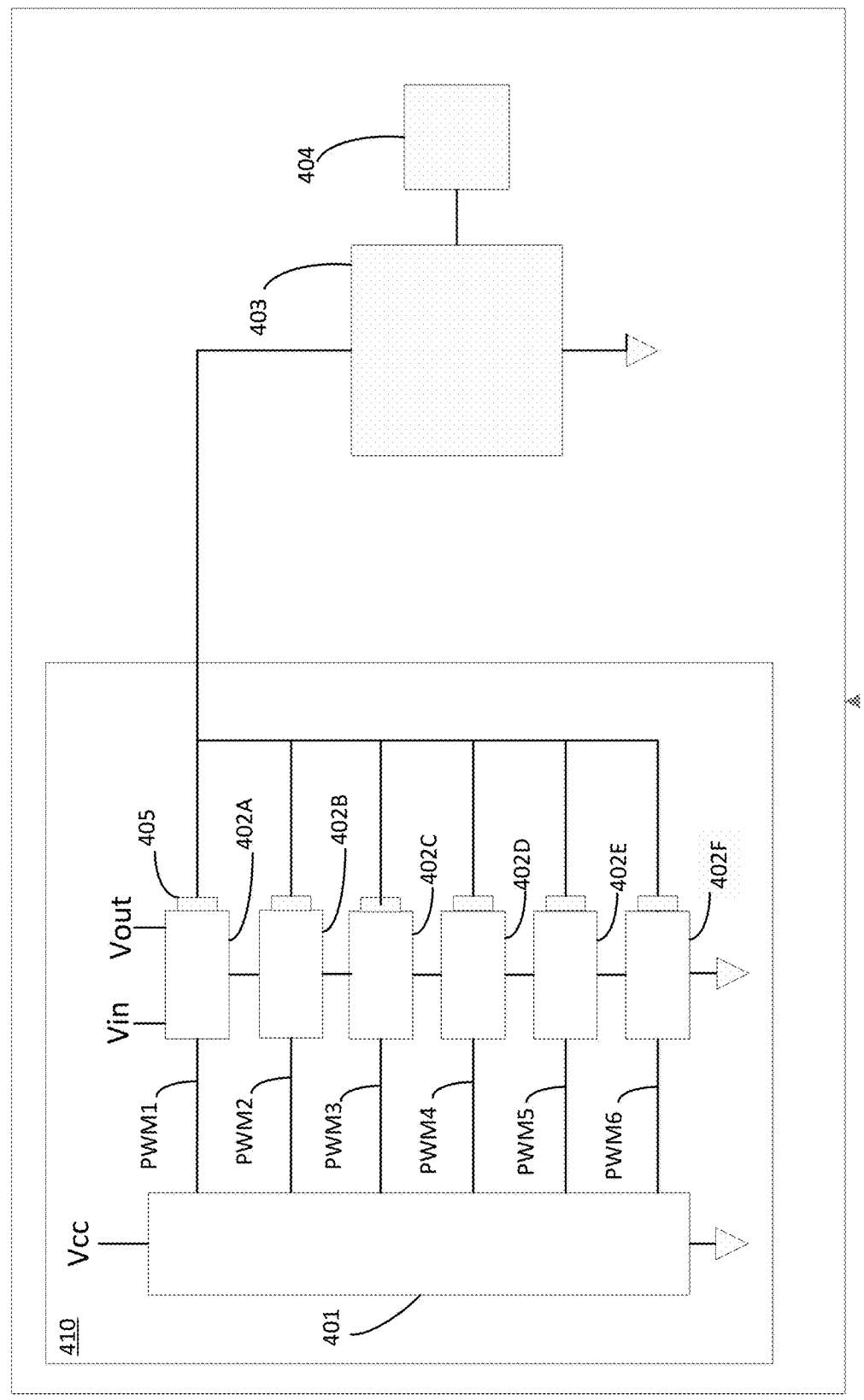

FIG. 4 illustrates an example of printed circuit assembly PCA comprising a multiphase voltage regulator according to the present disclosure.

Figure 5:
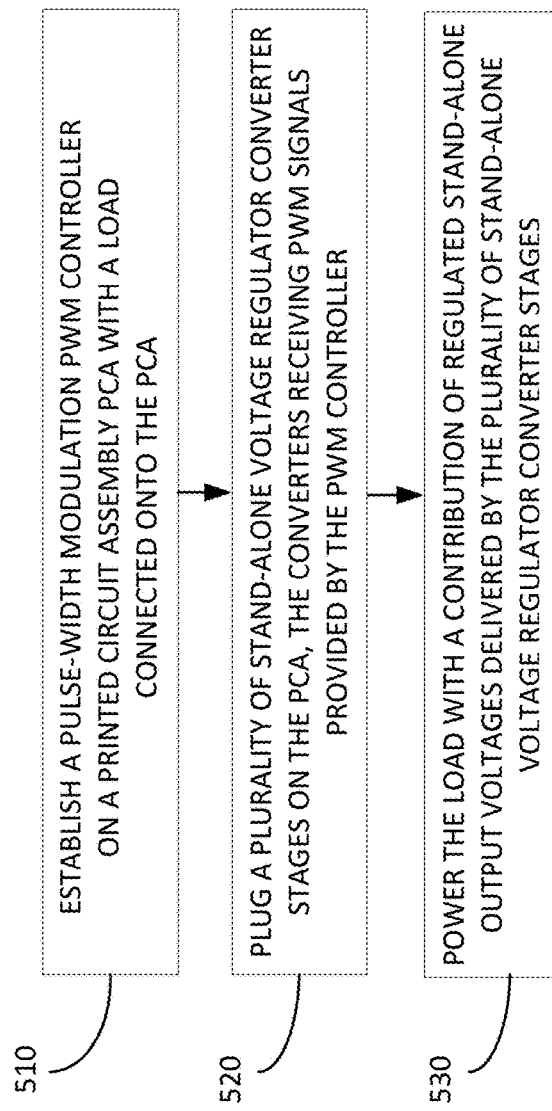

FIG. 5 illustrates an example of a flowchart for powering a load of a PCA with a multiphase voltage regulator according to the present disclosure.

Figure 6:
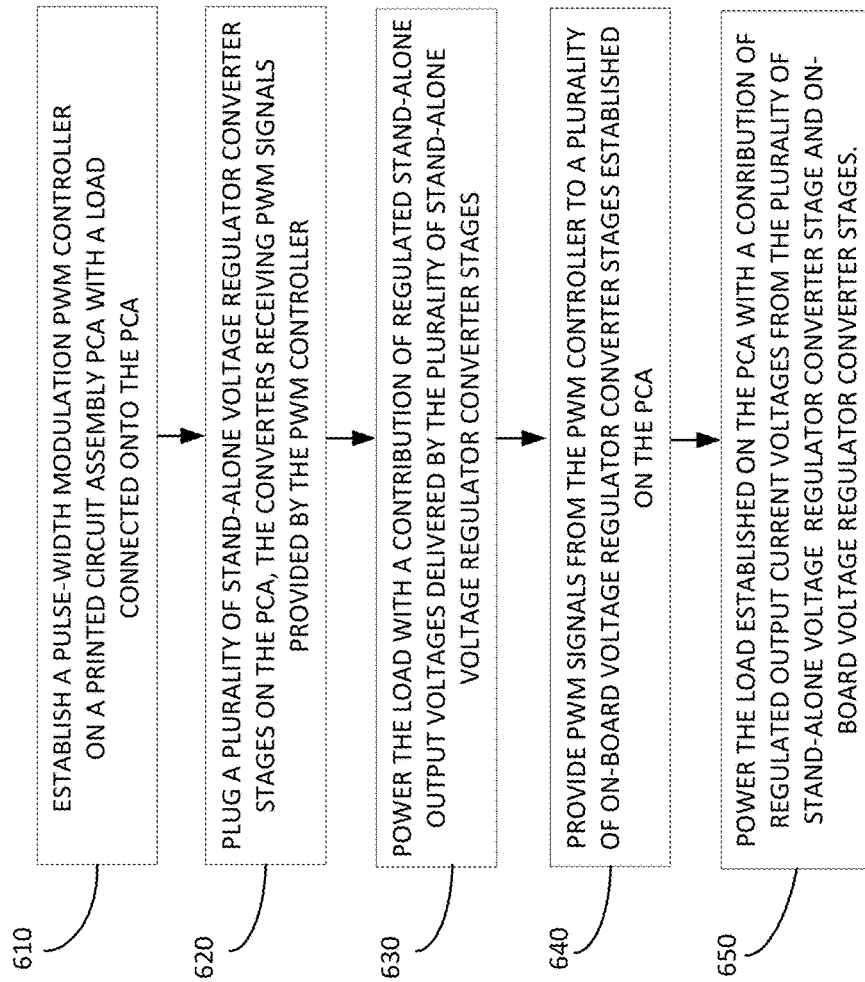

FIG. 6 illustrates another example of a flowchart for powering a load of a PCA with a multiphase voltage regulator according to the present disclosure.

DETAILED DESCRIPTION

FIG. 1 shows an example of a multiphase voltage regulator 100 according to the present disclosure. The multiphase voltage regulator 100 comprises a pulse-width modulation PWM controller 101 that outputs a plurality of PWM signals, e.g., PWM1, PWM2, PWM3 and PWM4, for driving a plurality of pluggable stand-alone voltage regulator converter stages 102A, 102B, 102O and 102D, respectively. The multiphase voltage regulators converter stages 102A, 102B, 102O and 102D use more than one phase in parallel and switching in phase shift order with each other to accomplish high bandwidth response to stringent output load transitions.

Each pluggable stand-alone voltage regulator converter stages 102A to 102D can be configured to receive one of the PWM signals PWM1 to PWM4 and deliver a regulated output voltage signal. A contribution of the regulated output voltage signals referenced as Vout in FIG. 1 can be delivered to a load 103 connected onto a printed circuit assembly PCA not shown in FIG. 1. Hence, current demand from load 103 is contributed by voltage regulator converters stages 102A to 102D.

FIG. 2 illustrates an example of the pluggable stand-alone voltage regulator converter stage 102A shown in previous FIG. 1 according to the present disclosure. The pluggable stand-alone voltage regulator converter stage 102A comprises an input capacitor 211 to filter an input voltage Vin, a driver 212 to receive a PWM signal PWM1 from the plurality of PWM signals PWM1 to PWM4 provided by the PWM controller 101 previously shown in FIG. 1. The input capacitor 211 can supply all the input current to the converter if the input wire to the converter is inductive. These capacitors should be carefully selected to satisfy the root mean square ("RMS") ripple-current RMS ripple current requirements to ensure that they do not overheat.

Furthermore, the pluggable stand-alone voltage regulator converter stage 102A comprises an upper power field-effect-transistor FET 213a and a lower power FET 213b operated by the driver 212 to deliver a regulated output voltage Vout based on the input PWM signal PWM1 and the input voltage Vin and a single inductor 214 and an output capacitor 215 to filter the regulated output voltage. Examples of voltage values for Vin are, e.g., 3.3 Volt, 5 Volt, 12.0 Volt and 24

Volt. Examples of voltage values for Vout are, e.g., 0.6 Volt, 1.0 Volt, 1.2 Volt, 1.5 Volt and 1.8 Volt. The output-filter requirements decrease in a multiphase implementation due to the reduced current in the power stage for each high frequency component of multiphase converter stages delivering power in phase shifted operation. Furthermore, ripple-current cancellation in the output-filter stage results in a reduced ripple voltage across the output capacitor 215 compared to a single-phase voltage converter.

FIG. 3 shows example of a multiphase voltage regulator 300 according to the present disclosure. The multiphase voltage regulator 300 comprises two on-board voltage regulator converter stages 302A and 302B and two pluggable voltage regulator converter stages 302C and 302D for four phases respectively, e.g., PWM1, PWM2, PWM3 and PWM4. PWM signals are Logic Level Signals, with three states: High, Low and Tri State. In some implementations, the four phases can be interleaved. Interleaving can reduce ripple currents at the input and output. It can also reduce hot spots on the PCB. The proposed multiphase voltage regulator 300 may reduce the root mean square, RMS-current power dissipation in the FETs of the on-board/pluggable stand-alone converter stages (213A and 213B, 313A and 313B) and inductors (214, 314). Interleaving may also reduce transitional losses.

Each on-board voltage regulator converter stage 302A and 302B comprises an input capacitor 311 to filter the input voltage Vin, a driver 312 to receive a PWM input signal PWM1 from the plurality of PWM signals provided by the PWM controller 301, an upper FET 313A and a lower power FET 313B controlled by the driver 312 to provide a regulated output voltage based on the PWM signal PWM1 and the input voltage Vin and a single inductor 314 and an output capacitor 315 to filter the regulated output voltage Vout.

Each on-board voltage regulator converter stage 302A and 302B receives a PWM signal and delivers a regulated output voltage signal. A voltage signal Vout may be the contribution of the regulated output voltage signals from the two on-board voltage regulator converter stages 302A and 302B and the two pluggable voltage regulator converter stages 3020 and 302D may be delivered to the load connected onto a PCA. In some implementations, the load is a low voltage high current transition load and comprises processing means and memory means. Furthermore, FIG. 3 shows connectors 305 to connect the pluggable stand-alone voltage regulator converter stages 302C and 302D on a PCA.

FIG. 4 shows an example of printed circuit assembly PCA 400 according to the present disclosure. THE PCA 400 comprises processing means 403 and memory means 404, and a multiphase voltage regulator 410 according to the present disclosure. The multiphase voltage regulator 410 comprises a pulse-width modulation PWM controller 401 to output a plurality of PWM signals PWM1 to PWM6 for driving six pluggable stand-alone voltage regulator converter stages 402a, 402B, 402C, 402D, 402E and 402F as the stand-alone voltage regulator converter stage shown in FIG. 2. Each pluggable stand-alone voltage regulator converter stage 402A to 402D receives one of the PWM signals PWM1 to PWM6, respectively and delivers a regulated output voltage signal to the load of the PCA 400 comprised by the processing means 403. Hence, a contribution of the regulated output voltage signals Vout is delivered to the high transient load connected onto the PCA 400.

As it can be seen in FIG. 4, each pluggable stand-alone voltage regulator converter stage 402a, 402B, 402C, 402D, 402E and 402F comprises a connector 405 to connect each of the pluggable stand-alone voltage regulator converter stage onto the PCA 400. In other implementations of the multiphase voltage regulator 410 may comprise on-board voltage regulator converter stage established on carriers, e.g., a chip carrier adapted to be assembled onto the PCA.

In other implementation, the PWM controller outputs six PWM signals for six phases, two pluggable stand-alone voltage regulator converter stages receive two PWM signals out of the six PWM signals PWM1 to PWM6 and four on-board voltage regulator converter stages receive four PWM signals out of the six PWM signals.

FIG. 5 illustrates an example of a flowchart 500 for powering a load of a PCA with a multiphase voltage regulator according to the present disclosure. An example of a PCA having a load can be, e.g., the PCA 400 shown in previous FIG. 4. The flowchart 500 comprises step 510 for establishing a pulse-width modulation PWM controller on a PCA comprising a load. The pulse-width modulation PWM controller may output a plurality of PWM signals for driving a plurality of pluggable stand-alone voltage regulator converter stages.

The multiphase voltage regulator may achieve a low voltage, high current, high slew rate step load transient load regulation to critical system loads, the PWM controller previously mentioned in step 510 may be part of a multi-phase voltage regulator. The PWM controller can be, e.g., the PWM controller 101 shown in FIG. 1, the PWM controller 301 shown in FIG. 3 or the PWM controller shown in FIG. 4.

The flowchart 500 comprises step 520 for plugging a plurality of pluggable stand-alone voltage regulator converter stages on the PCA, the pluggable stand-alone voltage regulator converter stages may receive PWM signals for driving a plurality of pluggable stand-alone voltage regulator converter stages from the PWM controller. Alternatively, multi-phase switching voltage regulators can be comprised on-board voltage regulator converter stages already assembled onto the PCA which houses target specific loads as, e.g., processors and Memory DIMMs and wherein each stage is associated with one phase.

The multiphase voltage regulators converter stages may use more than one phase in parallel and switching in phase shift order with each other to accomplish high bandwidth response to stringent output load transitions. Examples of pluggable stand-alone voltage regulator converter stages can be, e.g., references 102A, 102B, 1020 and 102D shown in FIG. 1. Examples of on-board voltage regulator converter stages can be, e.g., references 302A and 302B in FIG. 3.

The flowchart 500 comprises a step 530 for powering the load established on the PCA with a contribution of regulated output voltages delivered by the plurality of pluggable stand-alone voltage regulator converter stages. Examples of pluggable stand-alone voltage regulator converter stages can be, e.g., the converter stages 102A to 102D shown in FIG. 1 and FIG. 2, the pluggable converter stages 3020 and 302D shown in FIG. 3 and the converter stages 402A to 402D shown in FIG. 4. The pluggable stand-alone voltage regulator converter stages may comprise connecting means as connectors 305 shown in FIG. 3 and connectors 405 shown in FIG. 4 to permit the converter stages to be plugged onto the PCA and hence increase the number of phases of the multiphase voltage regulator if desired.

FIG. 6 illustrates another example of a flowchart 600 for powering a load of a PCA with a multiphase voltage regulator according to the present disclosure. The flowchart 600 comprises step 610 for establishing a pulse-width modulation PWM controller on a PCA with a load connected onto the PCA, the PWM controller may be of a multiphase voltage regulator. The pulse-width modulation PWM controller may output a plurality of PWM signals for driving a plurality of pluggable stand-alone voltage regulator converter stages a plurality of on-board voltage regulator converter stages or a combination thereof. The multiphase voltage regulator may achieve a low voltage, high current, high slew rate step load transient load regulation to critical system loads as previously mentioned in FIG. 5. The PWM controller may be part of a multiphase voltage regulator as previously mentioned. The PWM controller can be, e.g., the PWM controller 101 shown in FIG. 1, the PWM controller 301 shown in FIG. 3 or the PWM controller shown in FIG. 4.

The flowchart 600 comprises step 620 for plugging a plurality of pluggable stand-alone voltage regulator converter stages on the PCA, the pluggable stand-alone voltage regulator converter stages may receive PWM signals from the PWM controller established on the PCA on previous step 610. The PCA can house target specific loads as, e.g., processors and Memory DIMMs. Each pluggable stand-alone voltage regulator converter stage can be associated with one phase.

The flowchart 600 comprises a step 630 for powering the load established on the PCA with a contribution of regulated output voltages delivered by the plurality of pluggable stand-alone voltage regulator converter stages. In some implementations, the load is a low voltage high current transition load and comprises processing means and memory means. Examples of processing means and memory means are references 403 and 404 shown in previous FIG. 4.

Furthermore, the flowchart 600 comprises a step 640 for providing PWM signals from the PWM controller to a plurality of on-board voltage regulator converter stages established on the PCA. The plurality of on-board voltage regulator converter stages may be already assembled onto the PCA. Hence, one of the proposed implementations according to the present disclosure can comprise hybrid approach of designing a minimum number of phases on the PCA to meet a lowest common denominator power requirement of the target high transient load on the PCA by using on-board voltage regulator converter stages as a built-in resource of the PCA and using pluggable stand-alone voltage regulator converter stages for additional phases for higher power loads.

Furthermore, the flowchart 600 comprises a step 650 for powering the load established on the PCA with a contribution of regulated output current voltages from the plurality of pluggable stand-alone voltage regulator converter stages and the plurality of on-board voltage regulator converter stages. Hence, a hybrid approach of designing a minimum number of phases on the PCA can be achieved by using on-board voltage regulator converter stages as converter stages 302A and 302B shown in FIG. 3 in combination with pluggable stand-alone voltage regulator converter stages as, e.g., 102A to 102D shown in FIG. 1, references 3020 and 302D shown in FIG. 3 and references 402A to 402D shown in FIG. 4.

In some implementations, the flowchart 600 further comprises a step for providing 2 PWM signals from the PWM controller to two pluggable stand-alone voltage regulator converter stage plugged on the PCA (e.g., when two additional phase are desired) and providing 4 PWM signals to the four on-board voltage regulator converter stages established on the PCA (e.g., the PCA having four on-board voltage regulator converter stages as built-in resource). In this implementation, the two pluggable stand-alone voltage regulator converter stages may deliver two regulated stand-alone output current signals and the four PWM signals provided to the four on-board voltage regulator converter stages may cause to deliver four regulated output current signals.

In some implementations, the flowchart 600 further comprises a step for powering the load established on the PCA with a contribution of regulated output current voltages from the 2 pluggable stand-alone voltage regulator converter stages and the 4 on-board voltage regulator converter stages. Hence, this hybrid approach of designing a minimum number of phases on the PCA to meet a lowest common denominator power requirement of the target high transient load on the PCA by using four on-board voltage regulator converter stages as a built-in resource of the PCA and two pluggable stand-alone voltage regulator converter stages for two additional phases for higher power loads can be achieved in this implementation according to the present disclosure.

Furthermore, relative terms used to describe the structural features of the figures illustrated herein are in no way limiting to conceivable implementations. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements.

The invention claimed is:

1. A multiphase voltage regulator, comprising:
   a pulse-width modulation ("PWM") controller to output a plurality of interleaved PWM signals for driving a plurality of pluggable stand-alone voltage regulator converter stages,
   wherein:
      each pluggable stand-alone voltage regulator converter stage receives a respective one of the interleaved PWM signals and delivers a regulated output voltage signal, and
      a contribution of the regulated output voltage signals is delivered to a load connected onto a printed circuit assembly ("PCA").

2. The multiphase voltage regulator of claim 1, wherein the pluggable stand-alone voltage regulator converter stage comprises:
   an input capacitor to filter an input voltage;
   a driver to receive the respective PWM signal from among the plurality of interleaved PWM signals provided by the PWM controller;
   an upper power field-effect-transistor ("FET") and a lower power FET operated by the driver to deliver a regulated output voltage based on the received PWM signal and the filtered input voltage; and
   a single inductor and a second capacitor to filter the regulated output voltage.

3. The multiphase voltage regulator of claim 1, further comprising:
   a plurality of on-board voltage regulator converter stages, and wherein:
      each on-board voltage regulator converter stage receives a PWM signal from among the plurality of interleaved PWM signals and delivers a regulated output voltage signal, and a contribution of the regulated output voltage signals from the plurality of pluggable stand-alone voltage regulator converter stages and on-board voltage regulator converter stages is delivered to the load connected onto the printed circuit assembly PCA.

4. The multiphase voltage regulator of claim 3, wherein the on-board voltage regulator converter stage comprises:
an input capacitor to filter the input voltage;
a driver to receive a respective PWM signal from among the plurality of PWM signals provided by the PWM controller;
an upper power field-effect transistor ("FET") and a lower power FET controlled by the driver to provide a regulated output voltage based on the received PWM signal and the filtered input voltage; and
a single inductor and a second capacitor to filter the regulated output voltage.

5. The multiphase voltage regulator of claim 4, further comprising:
two pluggable stand-alone voltage regulator converter stages; and wherein:
the PWM controller outputs six PWM signals, one PWM signal for each of six phases,
each of the two pluggable stand-alone voltage regulator converter stages receives a respective PWM signal from among the six PWM signals;
the plurality of on-board voltage regulator converter stages includes four on-board voltage regulator converter stages; and
each of the four on-board voltage regulator converter stages receives a respective PWM signal from among the six PWM signals.

6. The multiphase voltage regulator of claim 1, wherein the load is a low voltage high transition load.

7. The multiphase voltage regulator of claim 6, wherein the load includes processing means, or memory means, or both processing means and memory means.

8. The multiphase voltage regulator of claim 7, wherein:
the processing means includes a microprocessor, a central processing unit, or a control processor unit; and
the memory means includes a dynamic random-access memory or a dual-inline memory module.

9. The multiphase voltage regulator of claim 1, wherein each pluggable stand-alone voltage regulator converter stage comprises a connector to connect the pluggable stand-alone voltage regulator converter stage onto the PCA.

10. A printed circuit assembly PCA, the PCA comprising:
a printed circuit board;
a load mounted on the printed circuit board; and
a multiphase voltage regulator mounted on the printed circuit board, the multiphase voltage regulator comprising:
a pulse-width modulation PWM controller to output a plurality of interleaved PWM signals for driving a plurality of pluggable stand-alone voltage regulator converter stages,
wherein:
each pluggable stand-alone voltage regulator converter stage receives one of the interleaved PWM signals and delivers a regulated output voltage signal, and
a contribution of the regulated output voltage signals is delivered to the load.

11. The PCA of claim 10, further comprising an on-board voltage regulator converter stage established on the PCA as part of the multiphase voltage regulator to receive a respective PWM signal from among the plurality of PWM signals provided by the PWM controller.

12. The PCA of claim 11, wherein the on-board voltage regulator converter stage delivers a regulated output voltage signal; and
wherein a contribution of the regulated output current signals from the plurality of pluggable stand-alone voltage regulator converter stages and on-board voltage regulator converter stages is delivered to the load.

13. The PCA of claim 10, wherein the load is a processing means or a memory means, or both the processing means and the memory means.

14. The PCA of claim 13, wherein the processing means includes a microprocessor or a control processor unit.

15. The PCA of claim 13, wherein the memory means includes a dynamic random-access memory or a dual-inline memory module.

16. The PCA of claim 10, wherein the load is a low voltage high current transition load.

17. A method, comprising:
providing a plurality of PWM signals from a PWM controller on a printed circuit board of a printed circuit assembly ("PCA") to a plurality of on-board, pluggable, stand-alone voltage regulator converter stages established on the PCA;
interleaving the plurality of PWM signals as they are provided to the on-board voltage regulator converter stages; and
powering the load established on the PCA with a contribution of regulated output current voltages from the plurality of stand-alone voltage regulator converter stage and on-board voltage regulator converter stages.

18. The method of claim 17,
wherein:
the plurality of on-board, pluggable, stand-alone voltage regulator converter stages includes two stand-alone voltage regulator converter stages plugged on the PCA and four on-board voltage regulator converter stages established on the PCA; and
further comprising:
providing two PWM signals from the PWM controller to the two stand-alone voltage regulator converter stages plugged on the PCA, and
providing four PWM signals to the four on-board voltage regulator converter stages established on the PCA.

19. The method of claim 18,
wherein:
the two stand-alone voltage regulator converter stages each deliver a respective regulated stand-alone output current signal; and
further comprising:
delivering a respective interleaved four regulated output current signals to each of four on-board voltage regulator converter stages.

20. The method of claim 19, further comprising:
powering the load established on the PCA with a contribution of regulated output current voltages from the two of the stand-alone voltage regulator converter stages and the four on-board voltage regulator converter stages.

* * * * *